(12) United States Patent
Daryanani et al.

(10) Patent No.: US 8,390,384 B1
(45) Date of Patent: Mar. 5, 2013

(54) PRECISION ON-BOARD TUNING OF EMBEDDED MICROCONTROLLER OSCILLATOR USING CHARGE TIME MEASUREMENT UNIT

(75) Inventors: Sonu Daryanani, Tempe, AZ (US); Frank Ziegenhorn, Hoehenkirchen (DE)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/301,248

(22) Filed: Nov. 21, 2011

(51) Int. Cl.
*G01R 23/00* (2006.01)
(52) U.S. Cl. ............ 331/44; 331/34; 331/111; 331/143; 331/177 R
(58) Field of Classification Search .............. 331/34, 331/44, 45, 111, 177 R; 341/166–168; 368/113, 368/120, 121
See application file for complete search history.

(56) References Cited

U.S. PATENT DOCUMENTS

| | | | |
|---|---|---|---|
| 6,614,313 B2 * | 9/2003 | Crofts et al. | 331/1 R |
| 7,460,441 B2 | 12/2008 | Bartling | 368/118 |
| 7,764,213 B2 | 7/2010 | Bartling et al. | 341/152 |
| 2002/0140438 A1 * | 10/2002 | Lund et al. | 324/678 |
| 2010/0134191 A1 * | 6/2010 | Kwan et al. | 331/16 |
| 2011/0001568 A1 * | 1/2011 | Lin | 331/34 |
| 2011/0228572 A1 * | 9/2011 | Lin et al. | 363/21.18 |

OTHER PUBLICATIONS

Bohn, Bruce, "Microchip CTMU for Capacitive Touch Applications", Microchip Technology Inc., Application Note AN1250, 22 pages, 2009.
Yedamale, P., et al., "See What You Can Do with the CTMU", Microchip Technology Inc., , Application Note AN1375, 14 pages, 2011.

* cited by examiner

*Primary Examiner* — Joseph Chang
*Assistant Examiner* — Jeffrey Shin
(74) *Attorney, Agent, or Firm* — King & Spalding L.L.P.

(57) ABSTRACT

Precision measurement of a period(s) of an embedded clock oscillator using a charge time measurement unit (CTMU) maintains a desired frequency accuracy of the embedded clock oscillator over a range of time, temperature and operating condition changes. The CTMU determines the free running frequency of the embedded clock oscillator and provides very accurate frequency (period) information for confirmation that a desired frequency, e.g., within 0.25 percent of the desired frequency, is running or an indication of how much and which direction to adjustment the frequency of the clock oscillator to maintain the frequency precision desired. Automatic frequency adjustment of the embedded clock oscillator may be implemented so as to maintain the desired precision frequency thereof. Temperature and voltage compensation profiles for maintaining the accuracy of the CTMU may be stored in a table, e.g., nonvolatile memory, for a further improvement in absolute frequency accuracy of the embedded clock oscillator.

20 Claims, 6 Drawing Sheets

PRECISION ON-BOARD TUNING OF EMBEDDED MICROCONTROLLER OSCILLATOR USING CHARGE TIME MEASUREMENT UNIT

TECHNICAL FIELD

The present disclosure relates to integrated circuit devices requiring a precision clock oscillator, and more particularly, to integrated circuit devices having a precision clock oscillator integrated with the integrated circuit device.

BACKGROUND

As integrated circuit devices incorporate more sophisticated and complex peripherals, there is a need for precise run-time control of an internal clock oscillator. For example, a USB 2.0 integrated peripheral must meet 0.25 percent clock frequency accuracy. A typical application would have to use an external crystal to control the clock frequency to that accuracy. However, an external crystal frequency determining device requires two integrated circuit pins for connection to the internal oscillator circuit in the integrated circuit device. This poses a problem for low pin count integrated circuit devices as two of the very few package pins must be dedicated for the external crystal.

An integrated circuit device oscillator using internal frequency determining elements would eliminate the external pins requirement for connection to a crystal. Such an oscillator having internal frequency determining elements, e.g., self contained oscillator, may be, for example but is not limited to, a resistor-capacitor (RC) oscillator. But a problem exists in that an internal self contained RC oscillator can drift in frequency even if it is precisely calibrated at the time of manufacture of the integrated circuit device. This drift may be attributed to package stress, fabrication soldering stress, temperature and/or voltage changes, etc.

SUMMARY

Therefore, a need exists for a precision run-time self-tuning mechanism that will maintain a desired frequency accuracy of an internal self contained clock oscillator over a range of time, temperature and operating condition changes.

According to an embodiment, an integrated circuit device with a frequency tunable internal clock oscillator having a precision frequency that is automatically maintained by using a charge time measurement unit (CTMU) may comprise a charge time measurement unit (CTMU) having a capacitor of known value and a constant current source of known value; a frequency tunable clock oscillator supplying a clock signal at a frequency to the CTMU; an analog-to-digital converter (ADC) coupled to the CTMU; and a digital processor having a memory, the digital processor is coupled to the CTMU, the frequency tunable clock oscillator and the ADC, wherein the digital processor causes the CTMU to begin charging the known value capacitor with the known value constant current source upon detection of a first logic transition of the clock signal indicating a beginning of a period thereof, the CTMU stops charging the capacitor upon detection of a second logic transition of the clock signal indicating an end of the period thereof, the ADC samples and converts a voltage on the capacitor to a digital voltage value, the digital processor reads the digital voltage value from the ADC and converts this digital voltage value into a period time value, the digital processor compares the period time value to a reference period time value, wherein: if the period time value is greater than the reference period time value then the digital processor causes the frequency tunable clock oscillator to increase the frequency thereof, if the period time value is less than the reference period time value then the digital processor causes the frequency tunable clock oscillator to decrease the frequency thereof, and if the period time value is substantially the same as the reference period time value then the frequency of the frequency tunable clock oscillator is not changed.

According to a further embodiment, the period time value represents a time value of a plurality of clock signal periods. According to a further embodiment, the CTMU may comprise a constant current source; a current steering switch coupled to the constant current source; the capacitor is coupled to the current steering switch, wherein the voltage on the capacitor increases substantially linearly in time when the current steering switch couples the constant current source to the capacitor; and a circuit for controlling the current steering switch, wherein the current steering switch couples the capacitor to the constant current source upon detection of the first logic transition of the clock signal and decouples the capacitor from the constant current source upon detection of a second logic transition of the clock signal.

According to a further embodiment, the circuit for controlling the current steering switch may comprise a first flip-flop having a positive edge triggered clock input coupled to the clock signal, and a reset input coupled to the digital processor; an inverter having an input coupled to the clock signal; a second flip-flop having a positive edge triggered clock input coupled to an output of the inverter, and a reset input coupled to the digital processor; and an AND gate having a first input coupled to a Q-output of the first flip-flop, a second input coupled to a Q-not output of the second flip-flop and an output coupled to a control input of the current steering switch; wherein the digital processor resets the first and second flip-flops.

According to a further embodiment, the circuit for controlling the current steering switch may comprise a divide by N frequency divider having an input coupled to the clock signal; a first flip-flop having a positive edge triggered clock input coupled to an output of the divide by N frequency divider, and a reset input coupled to the digital processor; an inverter having an input coupled to the output of the divide by N frequency divider; a second flip-flop having a positive edge triggered clock input coupled to an output of the inverter, and a reset input coupled to the digital processor; and an AND gate having a first input coupled to a Q-output of the first flip-flop, a second input coupled to a Q-not output of the second flip-flop and an output coupled to a control input of the current steering switch; wherein the digital processor resets the first and second flip-flops, and the divide by N frequency divider.

According to a further embodiment, the ADC is a successive approximation ADC. According to a further embodiment, the ADC is a sigma-delta ADC. According to a further embodiment, a voltage sampling circuit samples the voltage on the capacitor and couples the sampled voltage to the sigma-delta ADC.

According to a further embodiment, the digital processor calculates the clock signal period time value from the known value of capacitance and the digital representation of the voltage. According to a further embodiment, the digital processor is a microcontroller. According to a further embodiment, the digital processor is a microcontroller. According to a further embodiment, the digital processor is selected from the group consisting of a microprocessor, a digital signal processor (DSP), a programmable logic array (PLA) and an application specific integrated circuit (ASIC). According to a further embodiment, the CTMU, the frequency tunable clock oscillator, the ADC and the digital processor are fabricated on an integrated circuit die. According to a further embodiment, the integrated circuit die is enclosed in an integrated circuit package.

According to a further embodiment, the frequency tunable clock oscillator comprises an up/down counter and a plurality of binary weighted frequency determining elements. According to a further embodiment, the frequency determining elements are selected from any one or more of the group consisting of capacitors, resistors, inductors, and constant current sources. According to a further embodiment, the frequency of the tunable clock oscillator is maintained within at least 0.25 percent of a desired frequency. According to a further embodiment, a temperature sensor is coupled to the digital processor, and a temperature compensation look-up table is stored in the memory and used to compensate the CTMU over a temperature range of operation. According to a further embodiment, a voltage sensor is coupled to the digital processor and a voltage compensation look-up table is stored in the memory and used to compensate the CTMU over a voltage range of operation.

According to another embodiment, a method for maintaining a clock oscillator in an integrated circuit device at a precision frequency may comprise the steps of providing a charge time measurement unit (CTMU) having a capacitor of known value and a constant current source of known value; providing a frequency tunable clock oscillator supplying a clock signal at a frequency to the CTMU; providing an analog-to-digital converter (ADC) coupled to the CTMU; and providing a digital processor having a memory, the digital processor is coupled to the CTMU, the frequency tunable clock oscillator and the ADC, wherein upon detecting a first logic transition of the clock signal indicating a beginning of a period thereof the digital processor causes the CTMU to begin charging the known value capacitor with the known value constant current source, upon detecting a second logic transition of the clock signal indicating an end of the period thereof the CTMU stops charging the capacitor, sampling and converting a voltage on the capacitor to a digital voltage value with the ADC, reading the digital voltage value from the ADC with the digital processor, converting the digital voltage value into a period time value with the digital processor, comparing the period time value to a reference period time value with the digital processor, wherein: if the period time value is greater than the reference period time value then increasing the frequency of the tunable clock oscillator, if the period time value is less than the reference period time value then decreasing the frequency of the tunable clock oscillator, and if the period time value is substantially the same as the reference period time value then not changing the frequency of the frequency tunable clock oscillator. According to a further embodiment of the method, the period time value represents a time value of a plurality of clock signal periods.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure, a Charge Time Measurement Unit (CTMU) is used in determining the free running frequency of the internal self contained clock oscillator and provides very accurate frequency (period) information for confirmation that a desired precision clock frequency, e.g., within 0.25 percent of the desired frequency, is running or an indication of how much and which direction to adjustment the frequency of the clock oscillator to maintain the frequency precision desired. Automatic frequency adjustment of the internal self contained clock oscillator may be implemented so as to maintain the desired precision frequency thereof. Temperature and voltage compensation profiles for maintaining the accuracy of the CTMU may be stored in a table, e.g., nonvolatile memory, for a further improvement in absolute frequency accuracy of the internal self contained clock oscillator.

The CTMU is more fully described in Microchip applications notes AN1250, AN1375, etc., available at www.microchip.com, and U.S. Pat. Nos. 7,460,441 B2 and 7,764,213 B2; wherein all are hereby incorporated by reference herein for all purposes. The CTMU period/frequency measurement accuracy is achieved by charging a known value capacitor with a known value constant current source over a period or periods of the clock frequency, then sampling a voltage developed on the capacitor. This sampled voltage is then converted into a digital value with an analog-to-digital converter (ADC) and a look-up table may be used, or other means, to convert the digital value of the sampled voltage into a period (frequency) value for comparison against a period reference value. If the period value is greater than the period reference value then the oscillator frequency must be adjusted up in frequency, and if the period value is less than the period reference value then the oscillator frequency must be adjusted down in frequency. If the period value is within an acceptable range, e.g., 0.25 percent, of the desired frequency then no adjustment of the oscillator frequency is required.

The oscillator frequency may be adjusted through analog and/or digital means by switching in or out capacitors and/or resistors comprising the frequency determining circuit, voltage to a voltage variable oscillator can be adjusted to change the oscillator frequency up or down, current to a current variable oscillator can be adjusted to change the oscillator frequency up or down, etc. A digital processor, e.g., microcontroller, may be used to control the CTMU, sample voltage charge on the CTMU capacitor, determine the oscillator frequency (period) and cause correction to the oscillator frequency when necessary to maintain the desired oscillator frequency precision. This may all occur in an automatic closed loop fashion that is transparent to a user of the integrated circuit device.

Referring now to the drawing, the details of specific example embodiments are schematically illustrated. Like elements in the drawings will be represented by like numbers, and similar elements will be represented by like numbers with a different lower case letter suffix.

Figure 1:
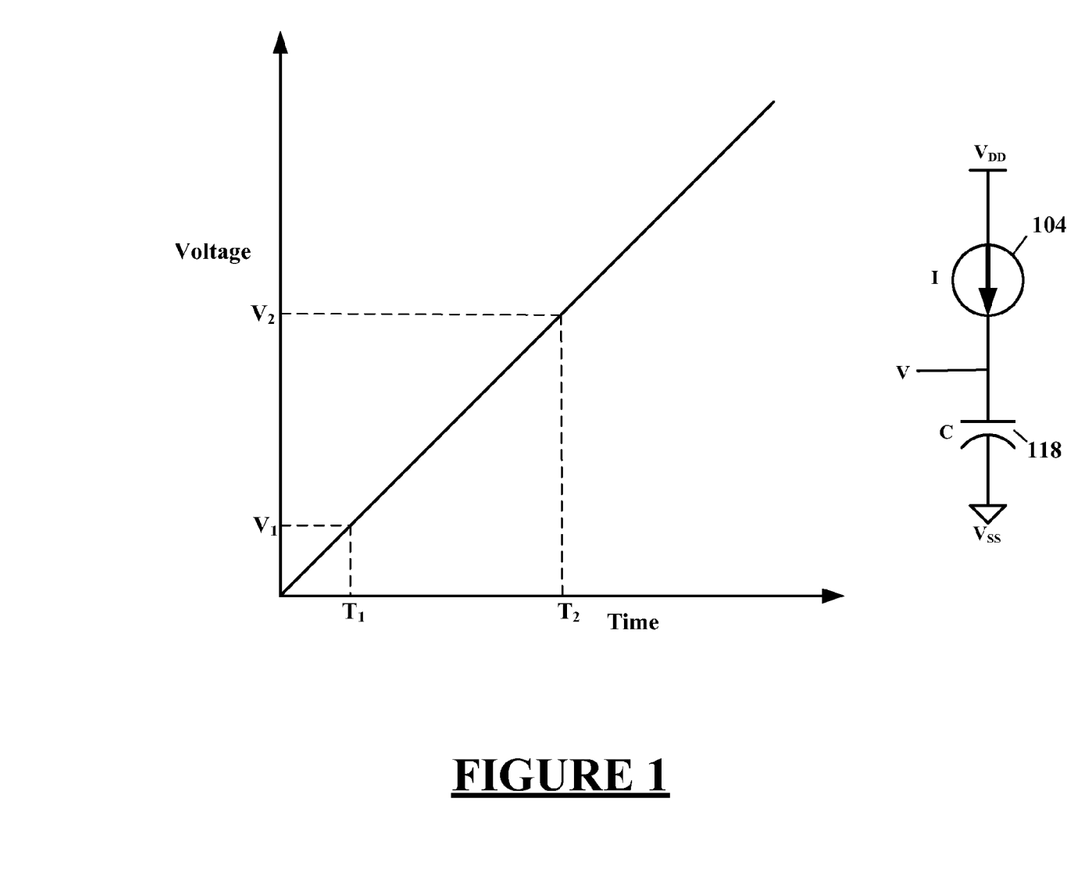
FIG. 1 illustrates a time-voltage graph of a capacitor being charged from a constant current source.

Referring to FIG. 1, depicted is a time-voltage graph of a capacitor being charged from a constant current source. When a capacitor 118 is charged through a constant current source 104, the voltage, V, across the capacitor 118 increases linearly with time, according to equation (1):

$$I = C * dV/dT \qquad \text{Eq. (1)}$$

where C is the capacitance value of the capacitor 118, I is the current from the constant current source 104 and V is the voltage on the capacitor 118 at time T. When any two values of the current, I; time, T; and voltage, V are known, the other unknown value may be calculated from the two known values. For example, if the capacitance of the capacitor 118 and the charging current from the constant current source 104 are known, then the time $T_1$ at voltage $V_1$ and the time $T_2$ at voltage $V_2$ may be determined. In a similar fashion, if voltages $V_1$ and $V_2$ (e.g., the voltage difference between $V_1$ and $V_2$) and the elapsed time between times $T_1$ and $T_2$ are known then capacitance, C, may be determined.

Figure 2:
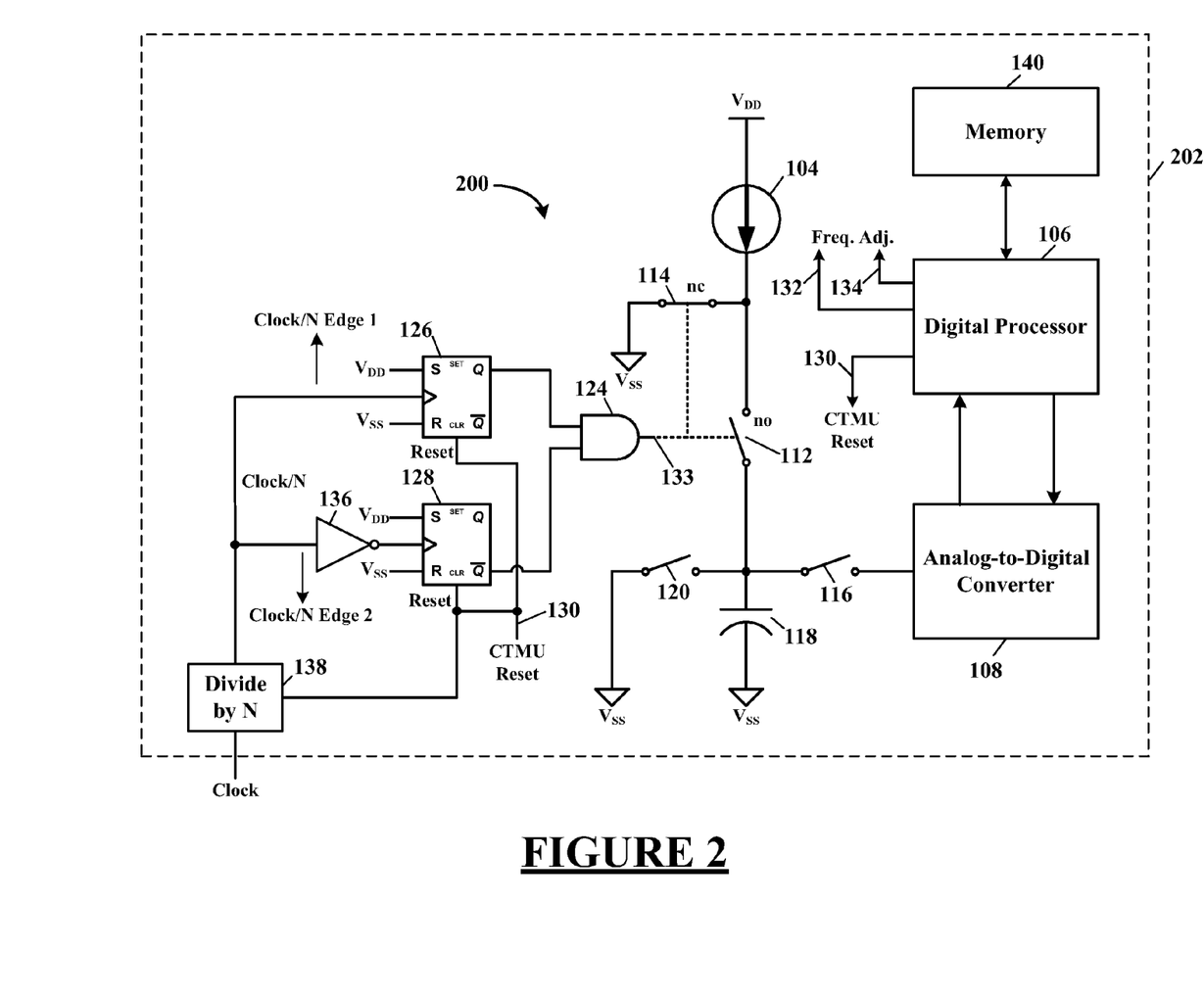
FIG. 2 illustrates a schematic diagram of a high resolution time period measurement circuit, according to the teachings of this disclosure.

Referring now to FIG. 2, depicted is a schematic diagram of a high resolution time period measurement circuit, according to the teachings of this disclosure. The high resolution time measurement circuit, generally represented by the numeral 200, may comprise a constant current source 104, current steering switches 112 and 114, a capacitor 118, a voltage sample switch 116, and a charge drain switch 120. The capacitor 118 may be initialized to substantially zero charge by closing the charge drain switch 120 so that any charge (voltage) on the capacitor 118 is removed (shorted to ground or common, $V_{SS}$). An initial charge (voltage) on the capacitor 118 may also be determined by sampling that voltage with an analog-to-digital converter (ADC) 108, e.g., sigma-delta, by closing the voltage sample switch 116. The capacitor 118 may be part of a switched capacitor successive approximation analog-to-digital converter wherein the voltage sample switch 116 is unnecessary.

The current steering switches 112 and 114 may be field effect transistors and the like, integrated onto an integrated circuit substrate (not shown) that may also contain other digital logic and analog circuits discussed more fully herein. The current steering switches 112 and 114 are configured so that the constant current source 104 always sees a load, i.e., when switch 114 is closed and switch 112 is open the constant current source 104 is coupled to common, $V_{SS}$, and when switch 112 is closed and switch 114 is open the constant current source 104 is coupled to the capacitor 118 from. The current steering switches 112 and 114 may be controlled from a start/stop control signal 133. For example, when the start/stop control signal 133 is at a logic "0" (low) the switch 114 is closed and the switch 112 is open, or when the start/stop control signal 133 is at a logic "1" (high) the switch 114 is open and the switch 112 is closed. The constant current source 104 charges the capacitor 118 to a voltage value directly dependent upon the length of time that the current steering switch 112 is closed as determined by equation 1 hereinabove.

The start/stop control signal 133 goes to a logic 1 upon the occurrence of a positive (e.g., logic 0 to logic 1) transition (e.g., ↑ Clock Edge 1) at the beginning (start) of an event for which a time period is to be determined. The capacitor 118 will be charged by the constant current source 104 until the current steering switch 112 is opened by the start/stop control signal 133 going back to a logic 0 upon the occurrence of a negative (e.g., logic 1 to logic 0) transition (e.g., ↓ Clock Edge 2) at the end of the event for which the time period is to be determined.

The start/stop control signal 133 may be generated with a logic circuit comprising a first flip-flop 126, a second flip-flop 128, an AND gate 124 and an inverter 136. Prior to the event occurring, the first and second flip-flops 126 and 128 have been reset (as well as the divide by N counter 138 if used) by a CTMU reset signal 130 from the digital processor 106 so that the Q-outputs of the first and second flip-flops 126 and 128 are at a logic 0. These Q-outputs, being at logic 0, cause the AND gate 124 output to be at a logic 0. The output of the AND gate 124 generates the start/stop control signal 133. When the ↑ Event Edge 1 occurs at the clock input of the first flip-flop 126, the Q-output thereof goes to a logic 1. Since the Q-not output of the second flip-flop 128 is also at a logic 1, the output of the AND gate 124 will go to a logic 1, thus generating a logic 1 for the start/stop control signal 133. The first and second flip-flops 126 and 128 are positive edge triggered (when the signal to the clock input of the flip-flop goes from a logic 0 (low) to a logic 1 (high)).

When the start/stop control signal 133 is at a logic 1, the current steering switch 112 closes (turns on) and the constant current source 104 begins charging the capacitor 118. The constant current source 104 continues charging the capacitor 118 until the start/stop control signal 133 goes back to a logic 0, thereby opening (turning off) the current steering switch 112. In this specific example, the output of the AND gate 124 (i.e., start/stop control signal 133) will go to a logic 0 when one or more of its inputs is at a logic 0. A logic 0 at an input of the AND gate 124 occurs when ↓ Clock Edge 2 occurs at the clock input of the second flip-flop 128. Thus the capacitor 118 only charges between the occurrences of ↑ Clock Edge 1 and ↓ Clock Edge 2. This sequence of toggling the flip-flops 126 and 128 can only occur once and the CTMU reset signal 130 has to be sent from the digital processor 106 before another time period sample of the clock frequency is taken again. Therefore, the digital processor 106 can sample the clock frequency at programmed intervals, wherein the intervals may be determined by the clock frequency drift characteristics of the integrated circuit device (integrated circuit die 202) and any frequency adjustments necessary thereto.

By measuring the voltage on the capacitor 118 with an analog-to-digital converter (ADC) 108 after the ↓ Clock Edge 2, a voltage representative of the time interval (period) between the ↑ Clock Edge 1 and the ↓ Clock Edge 2 may be used in combination with the known capacitance value of the capacitor 118 to calculate the time interval (period of the clock signal) with very precise resolution. For example, calculation of the event time period may be determined with the digital processor 106 performing the calculations of Eq. (1) hereinabove by using the measured voltage on the capacitor 118 and the known capacitance value thereof. Thus the time period measurement precision is a function of the ADC 108 resolution, e.g., 10 or 12 bits, and the accuracy of the measured capacitance of the capacitor 118. A further improvement in the resolution of the time period of the clock signal may be accomplished with a divide by N counter 138 that allows finer granularity of the ADC resolution in determining the time interval (period of the clock signal). The ADC output and period time may also be fine tuned during production of the integrated circuit device or in the field by using an external highly accurate frequency measurement device, e.g., frequency counter, to correlate the respective charge voltage measured on the capacitor 118 and the correlated results stored in a nonvolatile portion of the memory 140.

The charge drain switch 120 and the voltage sample switch 116 are merely for standard sample and hold operations wherein the capacitor 118 may be part of the sample and hold circuit feeding a sampled analog voltage to the analog input of the ADC 108, or may be part of a successive approximation ADC. The high resolution time period measurement circuit 200 may be fabricated on an integrated circuit die 202, and the integrated circuit die 202 may be enclosed in an integrated circuit package (not shown). The aforementioned high resolution time period measurement circuit 200 may be implemented with a Charge Time Measurement Unit (CTMU) peripheral as more fully described in Microchip applications notes AN1250, AN1375, etc., available at www.microchip.com, and U.S. Pat. Nos. 7,460,441 B2 and 7,764,213 B2; wherein all are hereby incorporated by reference herein for all purposes.

The memory 140 may be volatile and/or non-volatile memory. A software and/or firmware operating program, and temperature and/or voltage compensation table(s) may be stored in the memory 140 coupled to the digital processor 106. The temperature and/or voltage compensation table(s) may be defined during testing of the integrated circuit device by measuring the frequency, as referenced above, and correlating any changes to that frequency as a function of temperature and/or voltage.

Figure 3:
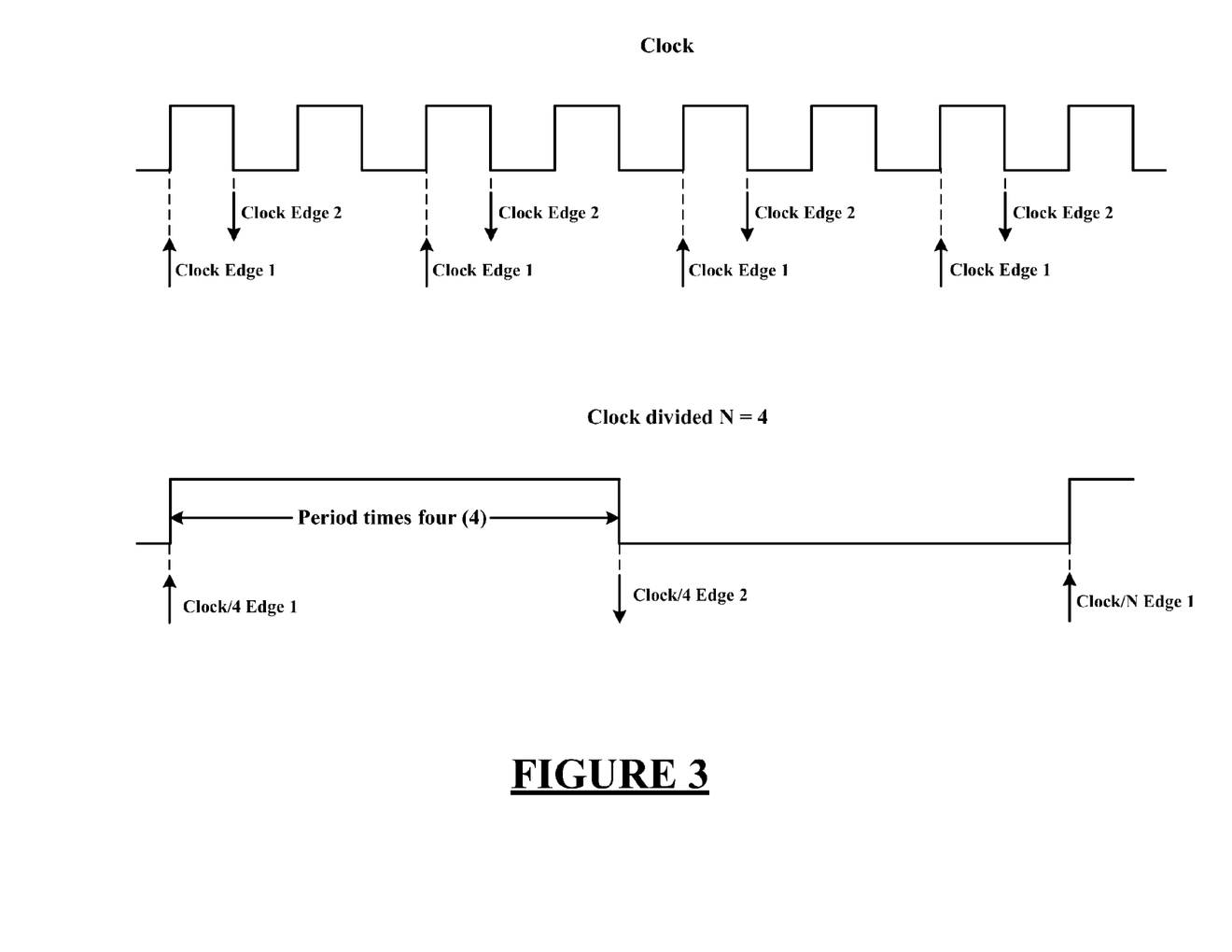
FIG. 3 illustrates a schematic timing diagram of the high resolution time period measurement circuit of FIG. 2.

Referring to FIG. 3, depicted is a schematic timing diagram of the high resolution time period measurement circuit of FIG. 2. In the top timing diagram a time period of the clock signal is taken between the Clock Edge 1 and the Clock Edge 2. In the bottom timing diagram a time period is taken that is four times the clock signal period. This is obtained by using the divide by N counter 138 and results in a finer granularity of time resolution. Since any frequency drift in the clock oscillator will be generally over a long time period compared to the period of the clock signal, a sample of the clock oscillator period need only occur at infrequent intervals when the clock frequency is within the desired frequency tolerance. Only when the clock frequency has to be changed to bring it back into the desired frequency tolerance will a more frequent sampling of the clock frequency period be required, e.g., after every frequency change a new time period measurement is made until the clock frequency is within the desired frequency tolerance.

Figure 4:
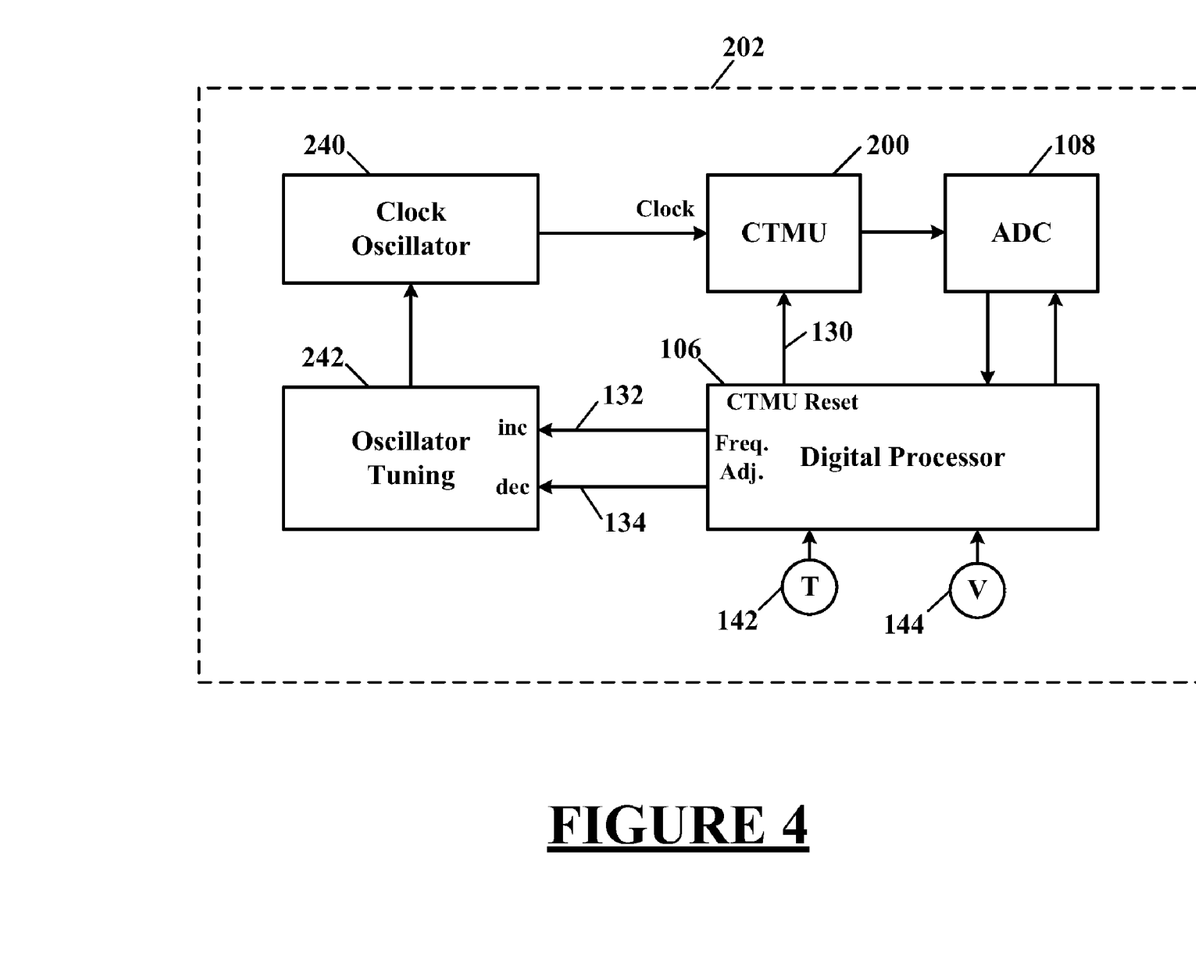
FIG. 4 illustrates a schematic block diagram of an integrated circuit device with an internal clock oscillator having on-board tuning of the oscillator using a CTMU for precision frequency determination and tuning thereof, according to a specific example embodiment of this disclosure.

Referring to FIG. 4, depicted is a schematic block diagram of an integrated circuit device with an internal clock oscillator having on-board tuning of the oscillator using a CTMU for precision frequency determination and tuning thereof, according to a specific example embodiment of this disclosure. The integrated circuit device 202 comprises a clock oscillator 240, an oscillator tuning circuit 242, a CTMU 200, an ADC 108, and a digital processor 106. The digital processor 106 may be, for example but is not limited to, a microcontroller, a microprocessor, a digital signal processor (DSP), a programmable logic array (PLA), an application specific integrated circuit (ASIC), etc.

An output of the clock oscillator 240 is coupled to a clock input of the CTMU 200. The CTMU 200 and the ADC 108 are used to precisely determine a period(s) of the clock oscillator 240, as shown in FIGS. 2 and 3 and described hereinabove. When the clock period (frequency) is greater (less) than a desired clock period (frequency), the digital processor 106 will send an increment signal 132 to the oscillator tuning circuit 242 which then increases the frequency of the clock oscillator 240. When the clock period (frequency) is less (greater) than the desired clock period (frequency), the digital processor 106 will send an decrement signal 134 to the oscillator tuning circuit 242 which then decreases the frequency of the clock oscillator 240. When the clock period is substantially the same as the desired clock period (frequency), the digital processor 106 will do nothing to cause the oscillator tuning circuit 242 to change the frequency of the clock oscillator 240.

A temperature sensor 142 and/or a voltage sensor 144 may be coupled to the digital processor 106 through an analog or digital interface depending upon the sensor's output. The temperature sensor 142 may be used in determining temperature compensation of the CTMU from a temperature compensation table stored in the memory 140. The voltage sensor 144 may be used in determining voltage compensation of the CTMU from a voltage compensation table stored in the memory 140.

Figure 5:
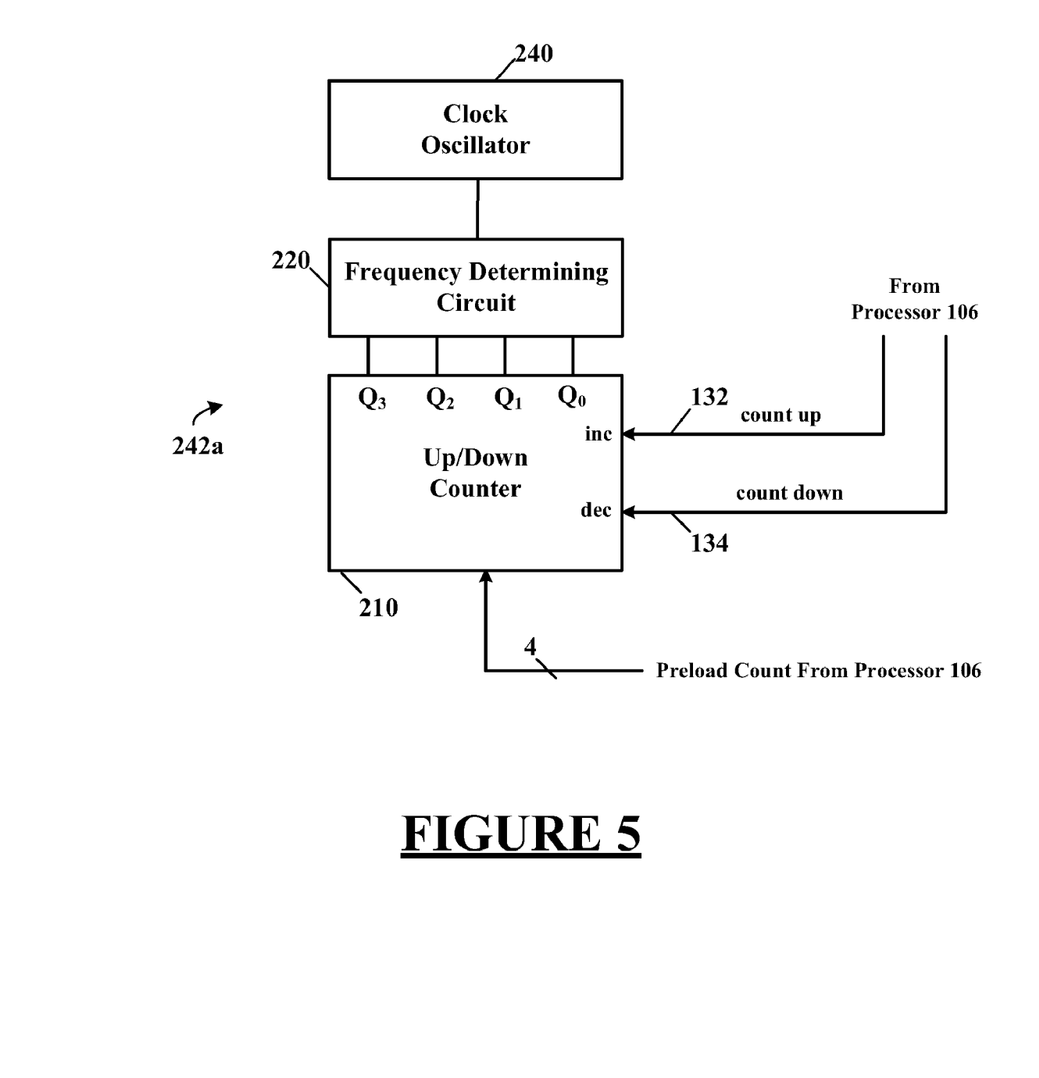
FIG. 5 illustrates a more detailed schematic block diagram of the internal clock oscillator and tuning circuits thereof shown in FIG. 5.

Referring to FIG. 5, depicted is a more detailed schematic block diagram of the internal clock oscillator and tuning circuits thereof shown in FIG. 4. The oscillator tuning circuit 242 may comprise an up/down counter 210 and a frequency determining circuit 220. The up/down counter 210 may be preloaded from the digital processor 106 with a specific count. This specific count may be determined at the time of manufacture of the integrated circuit device or in the field by a user during a calibration thereof. When the clock frequency is greater than the desired clock frequency the decrement signal 134 to the up/down counter 210 is asserted so that the frequency determining circuit increases the clock oscillator frequency, and when the clock frequency is less than the desired clock frequency the increment signal 132 to the up/down counter 210 is asserted so that the frequency determining circuit raises the clock oscillator frequency.

The frequency determining circuit 220 may be comprised of components such as capacitors (FIG. 6), resistors (not shown), inductors (not shown) constant current sources (not shown), etc., or any combination thereof. The tuning component values of the frequency determining circuit 220 may be increased and decreased according to the binary (or BCD) outputs $Q_3$-$Q_0$ of the up/down counter 210. Accordingly, the frequency of the clock oscillator 240 will change. The frequency change resolution may be determined by the number of bits of the up/down counter 210.

Figure 6:
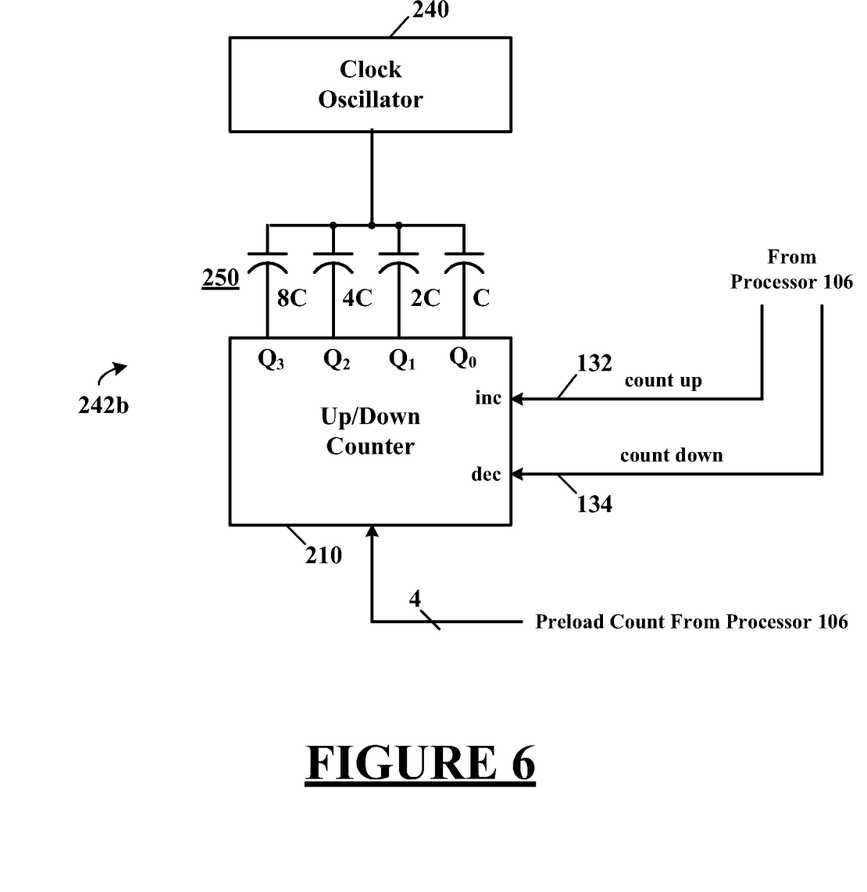
FIG. 6 illustrates a schematic diagram of the frequency determining circuit shown in FIG. 5, according to a specific example embodiment thereof.

Referring to FIG. 6, depicted is a schematic diagram of the frequency determining circuit shown in FIG. 5, according to a specific example embodiment thereof. The frequency determining circuit 220 (FIG. 5) may be comprised of a plurality of binary weighted capacitors 250 that are coupled to the clock oscillator 240 and determine the frequency thereof. Resistors and/or current sources may also be utilized in a similar fashion, implementation of which would be known by one having ordinary skill in digital circuit design and having the benefit of this disclosure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device with a frequency tunable internal clock oscillator having a precision frequency that is automatically maintained by using a charge time measurement unit (CTMU), said integrated circuit device comprising:
   a charge time measurement unit (CTMU) having a capacitor of known value and a constant current source of known value;
   a frequency tunable clock oscillator supplying a clock signal at a frequency to the CTMU;
   an analog-to-digital converter (ADC) coupled to the CTMU; and
   a digital processor having a memory, the digital processor is coupled to the CTMU, the frequency tunable clock oscillator and the ADC, wherein
      the digital processor causes the CTMU to begin charging the known value capacitor with the known value constant current source upon detection of a first logic transition of the clock signal indicating a beginning of a period thereof,
      the CTMU stops charging the capacitor upon detection of a second logic transition of the clock signal indicating an end of the period thereof,
      the ADC samples and converts a voltage on the capacitor to a digital voltage value,
      the digital processor reads the digital voltage value from the ADC and converts this digital voltage value into a period time value,
      the digital processor compares the period time value to a reference period time value, wherein:
         if the period time value is greater than the reference period time value then the digital processor causes the frequency tunable clock oscillator to increase the frequency thereof,
         if the period time value is less than the reference period time value then the digital processor causes the frequency tunable clock oscillator to decrease the frequency thereof, and
         if the period time value is substantially the same as the reference period time value then the frequency of the frequency tunable clock oscillator is not changed.

2. The integrated circuit device according to claim 1, wherein the period time value represents a time value of a plurality of clock signal periods.

3. The integrated circuit device according to claim 1, wherein the CTMU comprises:
   a constant current source;
   a current steering switch coupled to the constant current source;
   the capacitor is coupled to the current steering switch, wherein the voltage on the capacitor increases substantially linearly in time when the current steering switch couples the constant current source to the capacitor; and
   a circuit for controlling the current steering switch, wherein the current steering switch couples the capacitor to the constant current source upon detection of the first logic transition of the clock signal and decouples the capacitor from the constant current source upon detection of a second logic transition of the clock signal.

4. The integrated circuit device according to claim 3, wherein the circuit for controlling the current steering switch, comprises:
   a first flip-flop having a positive edge triggered clock input coupled to the clock signal, and a reset input coupled to the digital processor;
   an inverter having an input coupled to the clock signal;
   a second flip-flop having a positive edge triggered clock input coupled to an output of the inverter, and a reset input coupled to the digital processor; and
   an AND gate having a first input coupled to a Q-output of the first flip-flop, a second input coupled to a Q-not output of the second flip-flop and an output coupled to a control input of the current steering switch;
   wherein the digital processor resets the first and second flip-flops.

5. The integrated circuit device according to claim 3, wherein the circuit for controlling the current steering switch, comprises:
   a divide by N frequency divider having an input coupled to the clock signal;
   a first flip-flop having a positive edge triggered clock input coupled to an output of the divide by N frequency divider, and a reset input coupled to the digital processor;
   an inverter having an input coupled to the output of the divide by N frequency divider;
   a second flip-flop having a positive edge triggered clock input coupled to an output of the inverter, and a reset input coupled to the digital processor; and
   an AND gate having a first input coupled to a Q-output of the first flip-flop, a second input coupled to a Q-not output of the second flip-flop and an output coupled to a control input of the current steering switch;
   wherein the digital processor resets the first and second flip-flops, and the divide by N frequency divider.

6. The integrated circuit device according to claim 1, wherein the ADC is a successive approximation ADC.

7. The integrated circuit device according to claim 1, wherein the ADC is a sigma-delta ADC.

8. The integrated circuit device according to claim 7, further comprising a voltage sampling circuit for sampling the voltage on the capacitor and coupling the sampled voltage to the sigma-delta ADC.

9. The integrated circuit device according to claim 1, wherein the digital processor calculates the clock signal period time value from the known value of capacitance and the digital representation of the voltage.

10. The integrated circuit device according to claim 1, wherein the digital processor is a microcontroller.

11. The integrated circuit device according to claim 1, wherein the digital processor is selected from the group consisting of a microprocessor, a digital signal processor (DSP), a programmable logic array (PLA) and an application specific integrated circuit (ASIC).

12. The integrated circuit device according to claim 1, wherein the CTMU, the frequency tunable clock oscillator, the ADC and the digital processor are fabricated on an integrated circuit die.

13. The integrated circuit device according to claim 12, wherein the integrated circuit die is enclosed in an integrated circuit package.

14. The integrated circuit device according to claim 1, wherein the frequency tunable clock oscillator comprises an up/down counter and a plurality of binary weighted frequency determining elements.

15. The integrated circuit device according to claim 14, wherein the frequency determining elements are selected from any one or more of the group consisting of capacitors, resistors, inductors, and constant current sources.

16. The integrated circuit device according to claim 14, wherein the frequency of the tunable clock oscillator is maintained within at least 0.25 percent of a desired frequency.

17. The integrated circuit device according to claim 1, further comprising a temperature sensor coupled to the digital processor and a temperature compensation look-up table stored in the memory and used to compensate the CTMU over a temperature range of operation.

18. The integrated circuit device according to claim 1, further comprising a voltage sensor coupled to the digital processor and a voltage compensation look-up table stored in the memory and used to compensate the CTMU over a voltage range of operation.

19. A method for maintaining a clock oscillator in an integrated circuit device at a precision frequency, said method comprising the steps of:

provinding a charge time measurement unit (CTMU) having a capacitor of known value and a constant current source of known value;

providing a frequency tunable clock oscillator supplying a clock signal at a frequency to the CTMU;

providing an analog-to-digital converter (ADC) coupled to the CTMU; and providing a digital processor having a memory, the digital processor is coupled to the CTMU, the frequency tunable clock oscillator and the ADC, wherein upon detecting a first logic transition of the clock signal indicating a beginning of a period thereof the digital processor causes the CTMU to begin charging the known value capacitor with the known value constant current source, upon detecting a second logic transition of the clock signal indicating an end of the period thereof the CTMU stops charging the capacitor, sampling and converting a voltage on the capacitor to a digital voltage value with the ADC, reading the digital voltage value from the ADC with the digital processor, converting the digital voltage value into a period time value with the digital processor, comparing the period time value to a reference period time value with the digital processor, wherein:

if the period time value is greater than the reference period time value then increasing the frequency of the tunable clock oscillator, if the period time value is less than the reference period time value then decreasing the frequency of the tunable clock oscillator, and if the period time value is substantially the same as the reference period time value then not changing the frequency of the frequency tunable clock oscillator.

20. The method according to claim 19, wherein the period time value represents a time value of a plurality of clock signal periods.

* * * * *